(12) United States Patent
Klostermann et al.

(10) Patent No.: US 7,473,656 B2
(45) Date of Patent: Jan. 6, 2009

(54) METHOD FOR FAST AND LOCAL ANNEAL OF ANTI-FERROMAGNETIC (AF) EXCHANGE-BIASED MAGNETIC STACKS

(75) Inventors: Ulrich Karl Klostermann, Fontainebleau (FR); Wolfgang Raberg, Fontainebleau (FR); Philip Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 786 days.

(21) Appl. No.: 10/690,538

(22) Filed: Oct. 23, 2003

(65) Prior Publication Data

US 2005/0087519 A1   Apr. 28, 2005

(51) Int. Cl.
*H01L 21/00* (2006.01)
(52) U.S. Cl. .............. 438/795; 438/799; 117/3
(58) Field of Classification Search .............. 219/121.6, 219/121.65, 121.66, 121.84, 121.85; 29/603.08; 438/3, 795, 799; 117/2, 3, 32, 904, 917; 257/E43.006
See application file for complete search history.

(56) References Cited

U.S. PATENT DOCUMENTS

| | | | | |
|---|---|---|---|---|
| 4,390,392 A | * | 6/1983 | Robinson et al. | 438/473 |
| 4,787,551 A | * | 11/1988 | Hoyt et al. | 228/179.1 |
| 4,863,877 A | * | 9/1989 | Fan et al. | 438/492 |
| 5,147,826 A | * | 9/1992 | Liu et al. | 438/486 |
| 5,503,870 A | * | 4/1996 | Fontana et al. | 427/130 |
| 5,763,108 A | * | 6/1998 | Chang et al. | 428/812 |
| 6,123,781 A | * | 9/2000 | Shimazawa | 148/108 |
| 6,204,071 B1 | * | 3/2001 | Ju et al. | 438/3 |
| 6,294,911 B1 | * | 9/2001 | Shimazawa et al. | 324/210 |
| 6,313,014 B1 | * | 11/2001 | Sakaguchi et al. | 438/475 |
| 6,413,325 B1 | * | 7/2002 | Shimazawa et al. | 148/108 |
| 6,455,815 B1 | * | 9/2002 | Melgaard et al. | 219/390 |
| 6,478,884 B2 | * | 11/2002 | Shimazawa et al. | 148/108 |

(Continued)

FOREIGN PATENT DOCUMENTS

DE   3824127 A1 * 1/1990

(Continued)

OTHER PUBLICATIONS

NN84124287, IBM Technical Disclosure Bulletin, High Yield Anneal for Gallium Arsenide Wafers, Dec. 1, 1984, 1 page.*

(Continued)

*Primary Examiner*—Samuel M Heinrich
(74) *Attorney, Agent, or Firm*—McGinn IP Law Group, PLLC; Ido Tuchman, Esq.

(57) ABSTRACT

A method of thermally treating a magnetic layer of a wafer, includes annealing, for a predetermined short duration, a magnetic layer of a single wafer, applying at least one local magnetic field to the magnetic layer obtained without making electrical contact to the wafer, and cooling the single wafer using argon. The annealing includes heating only a local area on the single wafer at a temperature of 280 degrees C for 60 seconds in the presence of a magnetic field using a rapid thermal anneal (RTA) lamp. The applying a magnetic field to the magnetic layer is conducted after the annealing and ancludes applying local fields in different directions to different areas of the single wafer. The single wafer includes a magnetic stack formed thereon, the magnetic stcak having a structure of 50TaN/50Ta/175PtMn/15CoFe/9Al/50Py/100TaN.

1 Claim, 4 Drawing Sheets

U.S. PATENT DOCUMENTS

| | | | |
|---|---|---|---|
| 6,500,570 B2 * | 12/2002 | Hasegawa et al. | 428/811.2 |
| 6,594,446 B2 * | 7/2003 | Camm et al. | 392/416 |
| 6,613,678 B1 * | 9/2003 | Sakaguchi et al. | 438/695 |
| 6,649,423 B2 * | 11/2003 | Anthony et al. | 438/3 |
| 6,747,852 B2 * | 6/2004 | Lin et al. | 360/324.12 |
| 6,759,297 B1 * | 7/2004 | Dvorsky et al. | 438/257 |
| 6,787,372 B1 * | 9/2004 | Lee et al. | 438/3 |
| 6,904,669 B2 * | 6/2005 | Sato et al. | 29/603.1 |
| 6,918,965 B2 * | 7/2005 | Tuttle et al. | 148/108 |
| 7,026,229 B2 * | 4/2006 | Downey et al. | 438/530 |
| 7,056,749 B2 * | 6/2006 | Anthony | 438/3 |
| 7,112,354 B2 * | 9/2006 | Hannah et al. | 427/599 |
| 7,183,229 B2 * | 2/2007 | Yamanaka | 438/795 |
| 2002/0131202 A1 * | 9/2002 | Westwood | 360/110 |
| 2004/0040628 A1 * | 3/2004 | Tuttle et al. | 148/108 |
| 2004/0130323 A1 * | 7/2004 | Oohashi et al. | 324/252 |
| 2005/0001249 A1 * | 1/2005 | Anthony et al. | 257/295 |
| 2006/0044700 A1 * | 3/2006 | Paul et al. | 360/316 |

FOREIGN PATENT DOCUMENTS

| | | | |
|---|---|---|---|
| JP | 361188978 A | * | 8/1986 |
| JP | 362145718 A | * | 6/1987 |
| JP | 401117319 A | * | 5/1989 |
| JP | 04010553 A | * | 1/1992 |
| JP | 404196415 A | * | 7/1992 |
| JP | 09139426 A | * | 5/1997 |
| JP | 411173774 A | * | 7/1999 |
| JP | 02001217198 A | * | 8/2001 |
| JP | 2002093704 A | * | 3/2002 |
| JP | 02002299728 A | * | 10/2002 |

OTHER PUBLICATIONS

NN87044908, IBM Technical Disclosure Bulletin, Stabilizing Domain Networks in Thin Film Heads, Apr. 1, 1987, 1 page.*
NN9106412, IBM Technical Disclosure Bulletin, Ion Implant Dose Monitor With Infrared Transmission Measurement, Jun. 1, 1991, 4 pages.*

* cited by examiner

METHOD FOR FAST AND LOCAL ANNEAL OF ANTI-FERROMAGNETIC (AF) EXCHANGE-BIASED MAGNETIC STACKS

U.S. GOVERNMENT RIGHTS IN THE INVENTION

The subject matter of the present Application was at least partially funded under the Grant No. MDA972-99-C-0009 from the U.S. Defense Advanced Research Projects Agency (DARPA).

BACKGROUND OF THE INVENTION

1. Field of the Invention

The present invention generally relates to a method and system for thermally treating a magnetic layer, and more particularly to a method and system for fast and local annealing of a magnetic stack.

2. Description of the Related Art

Magnetic random access memory (MRAM) devices typically must undergo a thermal treatment to set some of the magnetic layers in a desired orientation. Generally, the samples must be held (e.g., for about 1 hour) at relatively high temperatures (300-400° C.), while a large (1-2 Teslas) and uniform magnetic field is applied.

However, a practical difficulty arises for performing such steps on large (200 or 300 mm diameter) wafers, as this entails building large anneal ovens and magnets to achieve uniform conditions over the wafer.

Additionally, the process is slow because of the size of the ovens, and the set direction cannot be varied from point-to-point on the wafer.

In a conventional technique 500, as shown in the flowchart of FIG. 5, a batch process uses a combined magnet and furnace, either in vacuum or inert gas.

In this conventional technique, the process flow 500 includes first loading a batch of wafers into a relatively large anneal oven and pumping down the oven (step 510) (optionally ramping up the magnetic field, if an electromagnet is being employed), ramping-up the temperature (e.g., 300-400° C.) and holding the temperature at a target value (step 520), applying a magnetic field and ramping down the temperature (step 530) (optionally ramping down magnetic field, if electromagnet was employed), and finally unloading the batch (step 540).

However, the above-described conventional technique 500 has many disadvantages.

First, there is uneven field and temperature uniformity across the batch. Additionally, there are a long ramp-up and ramp-down (e.g., of the temperature in the oven) times due to the large heat capacity. This makes the entire process relatively slow.

Additionally, since a batch mode processing is employed, one must wait for a batch of wafers to exist, in order to process them efficiently. That is, single wafers are generally not processed due to cost constraints. Instead, the user must work in increments (e.g., or batches), as such increments/batches are accumulated. Thus, there is little flexibility in the processing and difficult to tailor the processing to numbers of wafers less than a batch. Hence, in the conventional techniques, there is no local option in processing wafers.

Another disadvantage of the conventional techniques is the space required by such systems. That is, such systems are generally very large, heavy and cumbersome.

Additionally, complex and expensive magnetic field units are required, as good uniformity across the stack is normally needed. Without such complex and expensive magnetic field units, such uniformity is seldom achieved.

SUMMARY OF THE INVENTION

In view of the foregoing and other exemplary problems, drawbacks, and disadvantages of the conventional methods and structures, an exemplary feature of the present invention is to provide a method (and structure) for thermally treating a magnetic layer.

Another exemplary feature is to provide a method (and structure) for performing a fast and local annealing of magnetic stacks.

In a first exemplary aspect of the present invention, a method of thermally treating a magnetic layer of a wafer, includes annealing, for a predetermined short duration, a magnetic layer of a single wafer.

In a second exemplary aspect, a method for processing a magnetic stack, includes annealing a single wafer having a magnetic stack formed thereon, with a predetermined fast anneal in a presence of a magnetic field.

In third exemplary aspect of the present invention, an apparatus for treating a magnetic layer of a wafer, includes a heating element for annealing, for a predetermined short duration, a magnetic layer of a single wafer, and a magnet for applying a magnetic field during the annealing.

Thus, in the exemplary aspects of the present invention, a single wafer can be processed such that a heating element can be used to heat an entire (single) wafer completely at one time, or a local area on the wafer; and the local temperature is monitored using a detector (e.g., an infrared (IR) detector or the like). Then, a local magnetic field is applied at the heated area using a magnetic field generating structure (e.g., an electromagnet or permanent magnets). The heated area is then scanned or stepped across the wafer.

With the exemplary embodiments described herein, magnetic stacks using an exchange-biasing antiferromagnet such as PtMn can be reliably and efficiently annealed in a magnetic field after deposition, in order to align the pinning of the magnetic reference layer.

Further, unlike the conventional magnetic anneal furnaces having process times on the order of 5 to 10 hours per batch, the batch times achieved by the single wafer process of the present invention are on the order of 60 seconds per wafer or up to 60 minutes per batch (e.g., assuming 60 wafers in a batch). This is much faster than the conventional methods which require that the wafer be held at a temperature for 1-2 hours or more, but in which the entire cycle time of the conventional methods is much longer as mentioned above.

Additionally, the invention allows sequentially annealing of different areas of the same wafer in different directions. This feature may be of interest for a number of applications as described below.

Further, the invention allows higher temperatures to be used (e.g., up to 500° C. for a shorter time period).

Additionally, as noted above, a single wafer at a time can be processed, such that the single wafer can be completely heated up and cooled down. Thus, with the invention, it is possible to treat each wafer individually.

Hence, the invention avoids batch processing and all of its problems (including the difficulty of applying a homogeneous magnetic field over the entire batch of wafers and the use of a large magnet for providing such a field), by processing single wafers or portions of a wafer at a time.

BRIEF DESCRIPTION OF THE DRAWINGS

The foregoing and exemplary other purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1A:
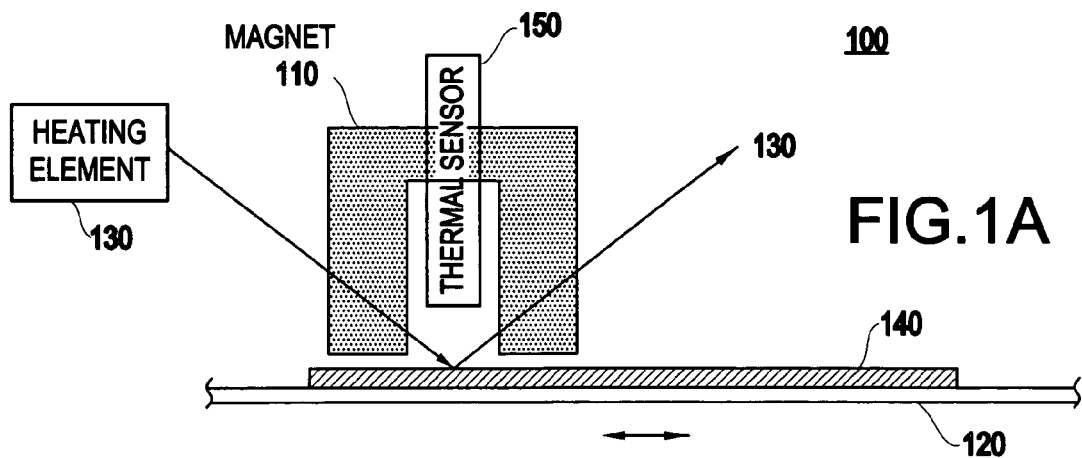
FIG. 1A illustrates an exemplary system 100 of the present invention.

Referring now to the drawings, and more particularly to FIGS. 1A-4, there are shown exemplary embodiments of the method and structures according to the present invention.

Exemplary Embodiment

As described above, during anneal a strong magnetic field is applied to align the anti-ferromagnet (AF) and the adjacent ferromagnetic layer in the desired direction. The result is an exchange-biased ferromagnetic layer that is pinned very strongly in a certain direction. A necessary requirement for a successful anneal process is a fully aligned ferromagnetic layer and/or a cool-down from temperatures above the blocking temperature (around 300° C. for PtMn) in a magnetic field.

It is noted that the invention is certainly not limited to PtMn, or a specific magnetic material, but can find great benefit with any material needing a set property needing the presence of a magnetic property. Moreover, any material having an intrinsic anisotropy needing a set magnetic property, would benefit from the invention.

In view of the foregoing and referring now to FIG. 1A, a system 100 according to the invention is provided.

System 100 includes a magnet 110 (e.g., preferably a permanent magnet but an electromagnet magnet may also be used) and a single wafer stage 120 with a heating element 130 facing the wafer surface 140.

It is noted that, with the magnet 110 of the invention, the field can be applied locally to the wafer surface 140, and thus instead of trying to generate a large field (e.g., about 1 tesla or more) over the entire wafer surface, the large field can be generated in only a small volume for the wafer portion that one is trying to anneal. This operation is much easier to do, and much easier to perform uniformly as compared to the conventional techniques which try to apply the field over the entire wafer.

Heating element 130 can be any of a rapid thermal anneal (RTA)-type (e.g., halogen) lamp, a laser (e.g., preferably having a very short pulse; of course, the invention is not limited to any particular value, as the duration corresponding to the designer requirements and constraints), a flashlight, a focused heat lamp, or the like. The preferred temperature range for the heating element is in a range from about 300 to 500° C., and a preferred duration of holding the wafer at the temperature is about 1-60 seconds (depending upon the temperature employed).

It is noted that the heating element (e.g., RTA devices, etc.) differs from the conventional heating elements (e.g., which are batch processing tools) in that the heating element tools of the invention can scan, make a line, make multiple points, etc.

Additionally, a thermal sensor 150 can be positioned advantageously adjacent the spot on the wafer to be heated up, thereby to sense a temperature of the area of interest and provide a feedback loop (not shown) to the heating element 130. Preferably, the magnetic field is turned on all of the time (except possibly when scanning the wafer) to speed the process even more.

By the same token, in a different exemplary embodiment, when the temperature sensed is at the desired temperature, the heating element 130 can be turned off and the aligning magnetic field can be applied. Thus, the temperature could be increased to the desired temperature, then turned off, and then, as the wafer is cooling off, the aligning field could be applied at least once (and in some applications depending upon the designer's requirements, it may be desirable to selectively apply the field a plurality of times).

Figure 1B:
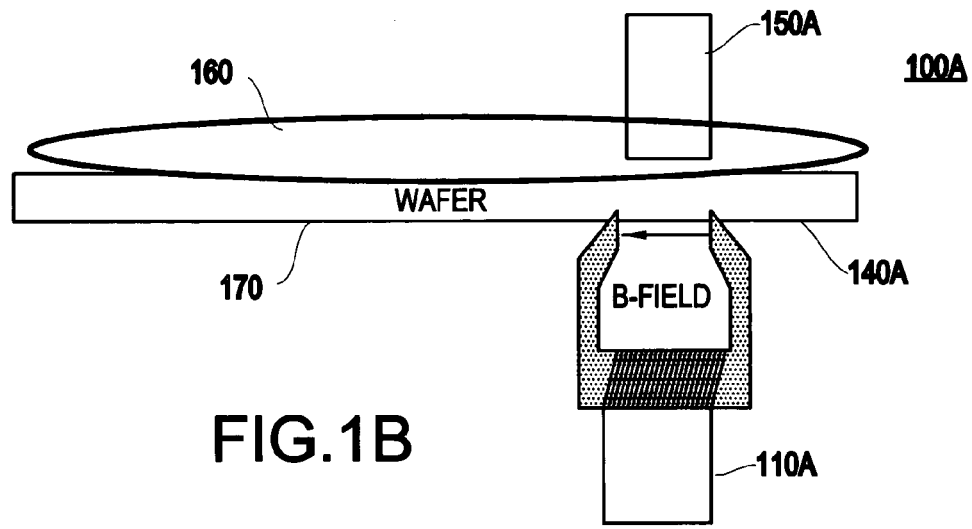
FIG. 1B illustrates another system 100A, somewhat similar to that shown in FIG. 1A, in which there is simultaneous heating and field scanning.

FIG. 1B illustrates another system 100A, somewhat similar to that shown in FIG. 1A, in which there is simultaneous heating and field scanning.

FIG. 1B shows a single wafer 140A which is fixed and the heat and magnetic field being scannable (e.g., movable). However, the invention also may have the wafer 140A being movable, and the heat and magnetic field being stationary. In FIG. 1B, the wafer 140A is shown in an active furnace region (not referenced) via extreme laser/halogen/flash annealing. Also shown in FIG. 1B is a thermal sensor 150A.

Additionally, as shown, the frontside of the wafer is shown undergoing the stack annealing (e.g., at reference numeral 160), whereas the magnetic field generation (e.g., generated by magnets 110A on the backside of the wafer 140A) is performed on the backside and frontside of the wafer. The backside of the wafer is undergoing cooling (e.g., at reference numeral 170) in the exemplary arrangement of FIG. 1B. Hence, the wafer is relatively cool at a portion away from the heating element/magnetic field being generated.

As described hereinbelow, in a first example of the invention, a fast processing of the wafer would result, whereas in a second example a spatially resolved anneal of different locations of the wafer would result.

First Exemplary Method

Figure 1C:
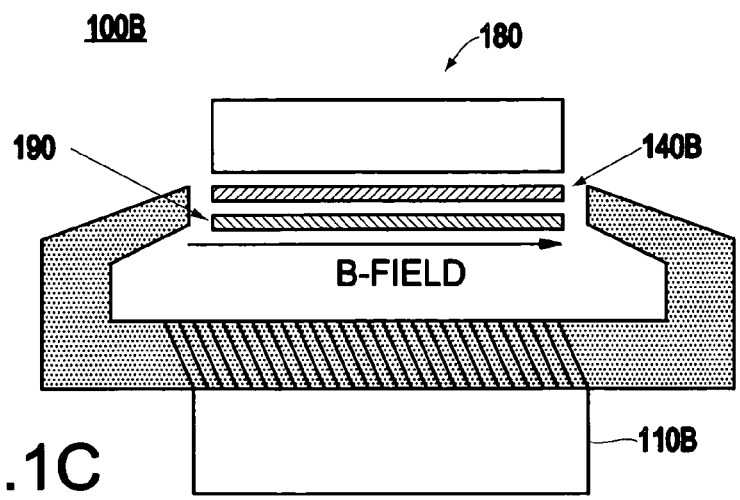
FIG. 1C illustrates a system 100B for performing a complete wafer anneal.

FIG. 1C illustrates a system 100B for performing a complete wafer 140B anneal according to the first exemplary method of the invention.

That is, in this technique, one wafer 140B at a time is processed, but the full wafer 140B is processed simultaneously. Preferably, a flash lamp, laser, or a RTA-type lamp is used in this process (e.g., see reference numeral 180 for the active heat region), in which the wafer is heated up quickly and cooled quickly. Cooling is shown at reference numeral 190. Magnet 110B applies the magnetic field.

Figure 2:
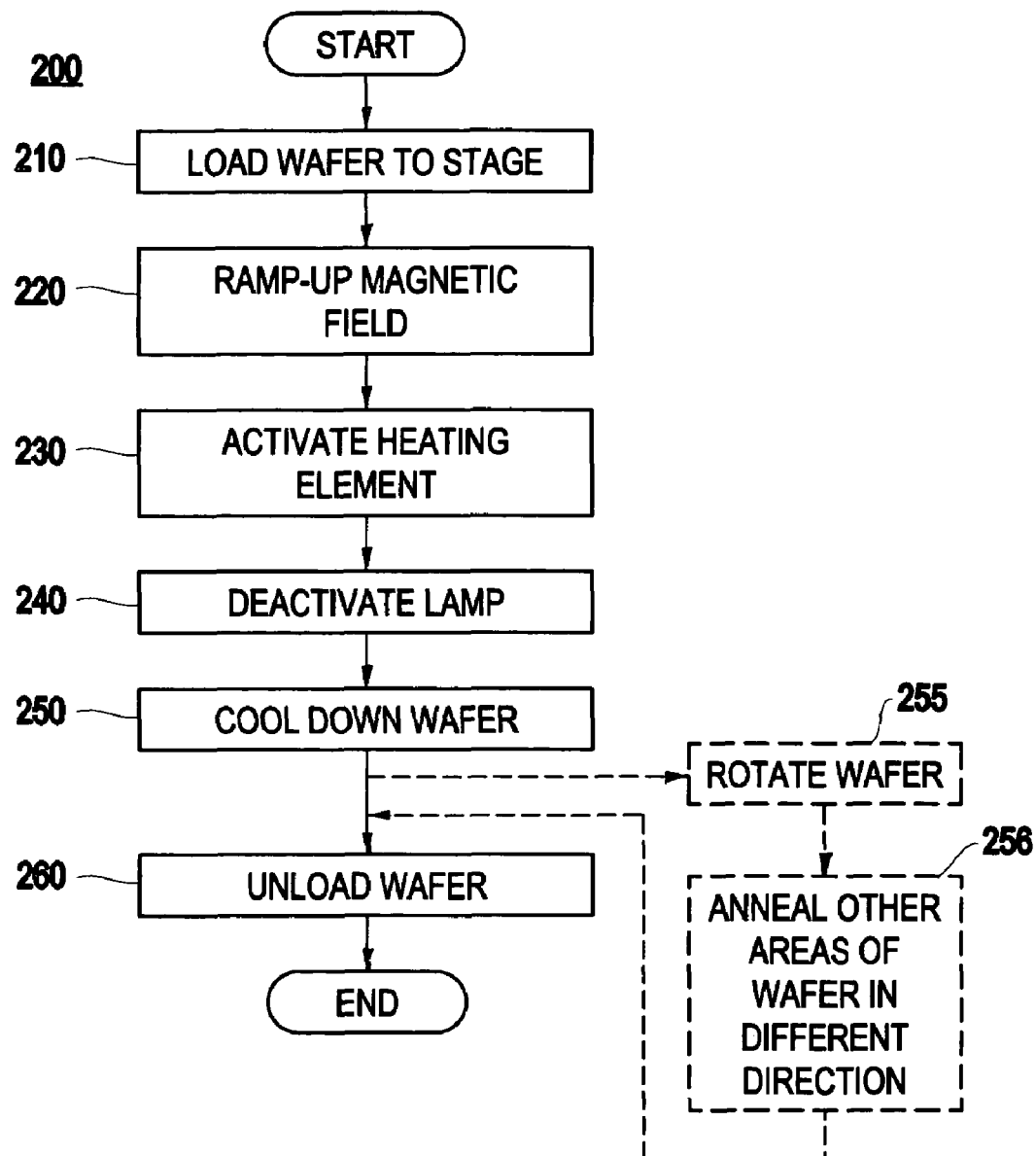
FIG. 2 illustrates a flowchart of an exemplary embodiment of a method 200 according to the present invention.
Figure 3:
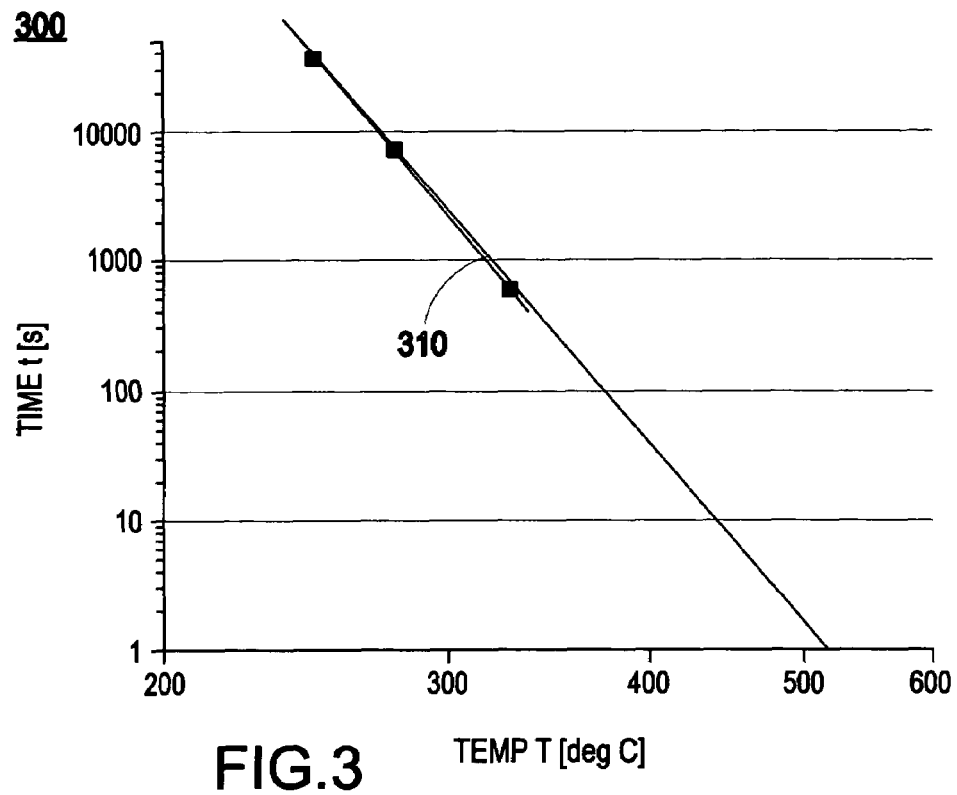
FIG. 3 is a graph 300 illustrating that a fast anneal is possible on magnetic stacks.

FIG. 2 shows a flowchart of a method 200 according to the first exemplary method of the invention. In step 210 of method 200, first a wafer is loaded to the stage.

Then, in step 220, the magnetic field is ramped-up, and in step 230 the heating element (e.g., lamp, laser etc.) is turned-on and held for a necessary time.

In step 240, the lamp is turned-off, and in step 250 the wafer is cooled down (e.g., with He or the like). The present invention is not limited to a particular medium for cooling the wafer. Indeed, nitrogen, argon, cooling liquid such as water, etc., and/or a vacuum (e.g., just letting the wafer sit) could be employed. Hence, no cooling (vacuum, if no gasses are desired) or convection cooling (e.g., nitrogen, argon, helium, etc.) could be employed.

Finally, in step 260, the wafer is unloaded. Thus, the full wafer annealing is completed.

A second exemplary option of the invention is directed to processing only portions (e.g., point-by-point) of the wafer at a time. One of the advantages of processing point-by-point across the wafer is that one can change the direction of the magnetic field point-by-point, and in some structures it is advantageous to set the direction in the orthogonal direction. This is not possible in the conventional annealing ovens, with the conventional techniques performing batch processing.

The process can flow point by point sequentially, or multiple points in parallel. Different field strengths and orientations can be applied to these different locations.

The second example of the present invention would allow, for example, a rotation (as shown in optimal step 255 of FIG. 2) of the wafer after cool down, and annealing (in optional step 256 of FIG. 2) of other areas of the wafer in a different direction. For example, as shown in FIG. 3B, the wafer could be rotated a predetermined angle (e.g., 45, 90 degrees etc.) to process the individual wafer (or a different spot on the wafer) differently. This technique would be useful in sensor-bridge applications (e.g., where the orientation of the reference layer may be aligned differently, which is not possible with batch processing). Another application would be for providing different module orientations in embedded (e)-DRAMS design and the like. That is, the DRAM designer may want the embedded modules to be rotated in a certain manner (e.g., 90 degrees). The local annealing would provide much flexibility in the DRAM design to the DRAM designer/engineer. Thus, these are but two exemplary applications of the local annealing.

It is noted that the local magnet can be designed in a way that the local field of the present invention does not perturb any structures which have been set already. Also, the local confinement of the heat to the area of setting does not cause significant perturbance in deselected, cold (hence not activated) neighboring regions.

FIG. 3A illustrates a graph 300 that shows that fast anneals are possible with the present invention.

That is, FIG. 3A shows a graph 300 with the typical anneal times as a function of temperature. As the temperature increases, the time required for the anneal decreases. The current typical temperatures and the time required is shown at reference numeral 310. Hence, as shown, this makes it possible to go from a batch process to a single wafer process.

Thus, based on the data in FIG. 3A, it can be expected that going to higher temperatures, for shorter times, good magnetic properties can be desirably achieved. Hence, a process is provided where each wafer is processed very quickly, and wafer processing can be performed one after another.

Figure 4:
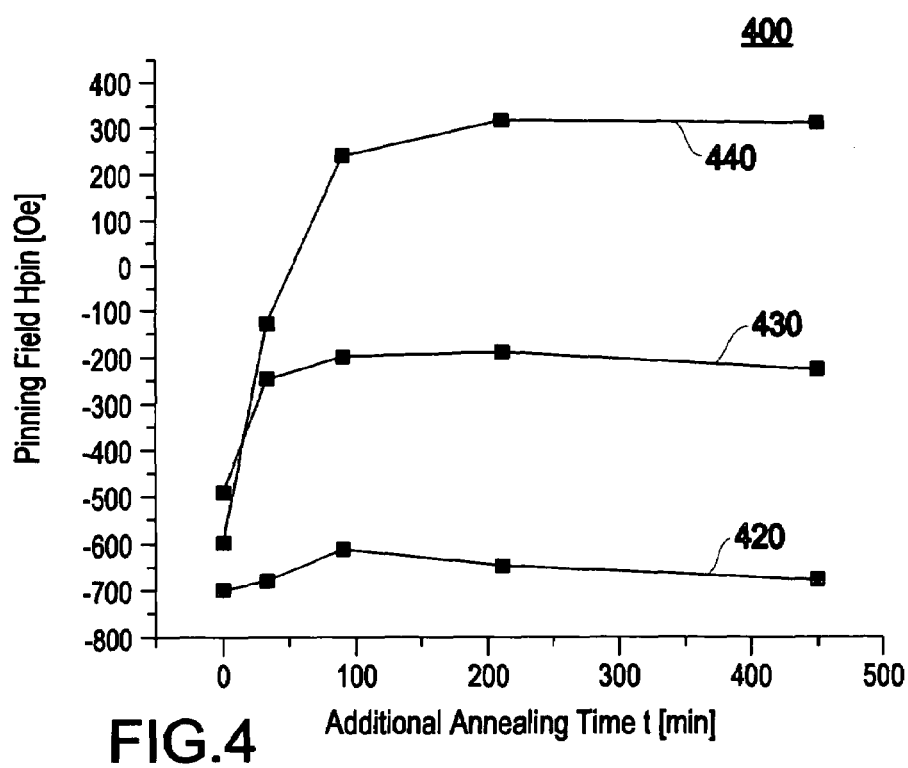
FIG. 4 is a graph 400 illustrating that a wafer level processing.
Figure 5:
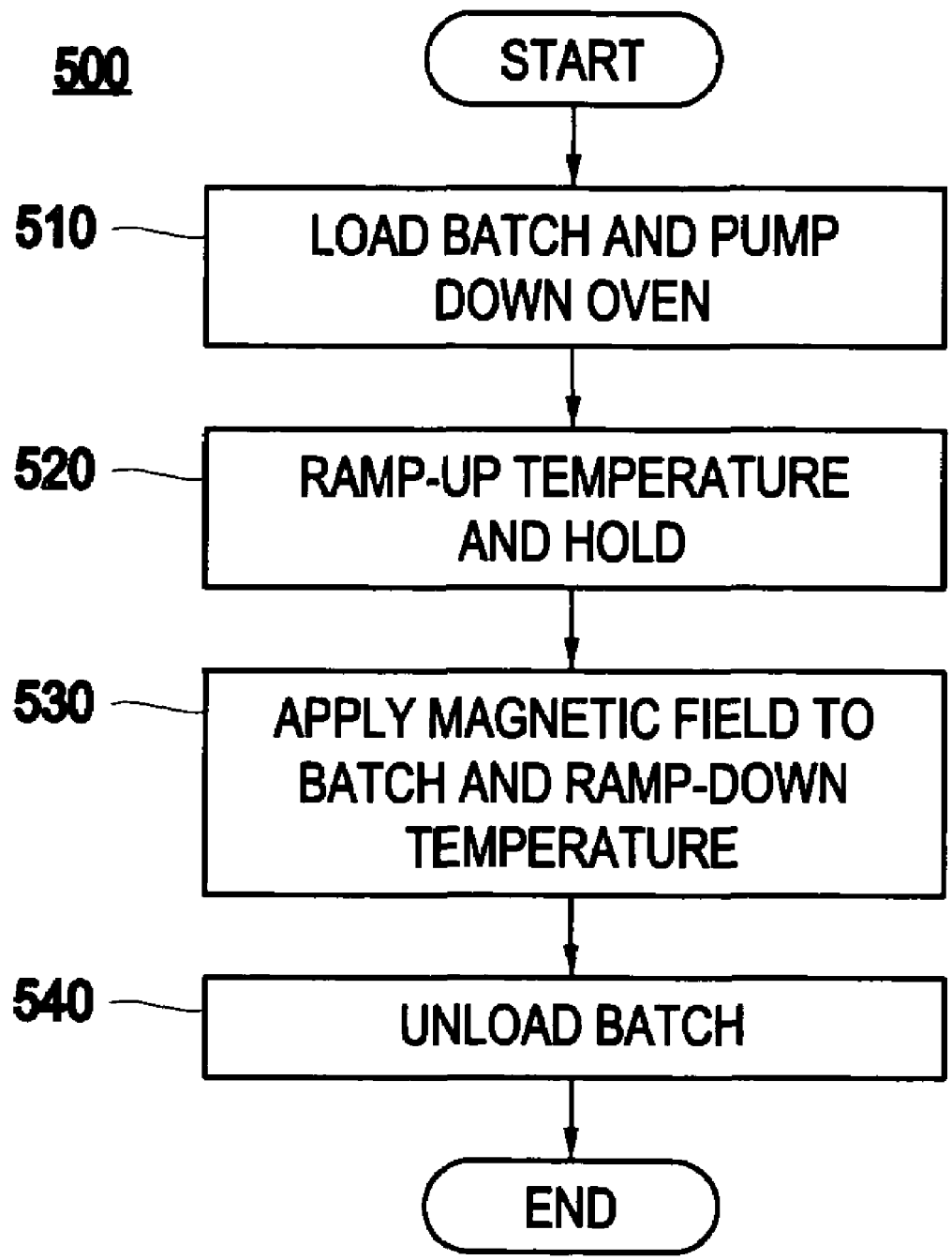
FIG. 5 illustrates a flowchart of a conventional method 500 for annealing of magnetic stacks.

Additionally, FIG. 4 is a graph 400 illustrating a wafer level processing. More specifically, the pinning field vs. the anneal time at 280° C. is shown.

In FIG. 4, a stack (SP FET) having a structure of 50TaN/50Ta/175PtMn/15CoFe/9Al/50Py/100TaN was investigated. Reference numeral 420 represents a parallel field, reference numeral 430 represents a perpendicular field decay, and reference numeral 440 represents a reversed field decay. The graph 400 demonstrates that the best magnetic device properties (e.g., pinning field) are normally achieved during the first, virgin activation of the antiferromagnetic system in the presence of a magnetic field. Any further resets in magnetic field are shown to be less effective. Thus, it is preferred to magnetically set devices on the wafer level, before any other thermally hot downstream, device-fabrication-processes are done. Hence, only a single magnetic anneal step after the device has been fabricated (e.g., after wafer cutting or packaging) could result in insufficient magnetic performance of the device.

With the invention, a single wafer process with short process time due to low heat capacity (only one wafer, only one surface is annealed) can be provided.

Thus, unlike a batch process in which 10 to 40 wafers could be processed per hour, with the typical batch size being 25-100, the invention can provide advantageously a single wafer process in which 60 wafers may be processed per hour, with each single wafer process taking on the order of 1-60 seconds. Thus, the invention provides high throughput, and it is batch size independent (e.g., there is no accumulation time). Additionally, there is higher process flexibility and improved wafer logistics.

Additionally, the process of the invention can use a relatively small magnet volume as only a sufficiently homogeneously field in one wafer plane (i.e., z-dimension is~film thickness) has to be achieved and not over the entire batch volume (i.e., z-dimension~batch size times wafer pitch), as in conventional anneal furnaces. As a result, the magnet have less weight allowing also a smaller footprint, thereby taking up little production floor space.

Further, there are less requirements for temperature and magnetic field uniformity since only the wafer surface has to be optimized.

Further, there are less requirements for temperature and magnetic field as only a spatially limited region has to be uniform in temperature and magnetic field (e.g., in the second option)

Further, identical process conditions are provided for each wafer (no position dependency). Moreover, there is optional local resolution Additionally, the system is not dependent on the size of the wafer so it is easier to scale up. Further, the thermal treatment can be applied to only those areas that need to be set.

Additionally, the set conditions can be changed locally, so that different parts of the wafer can be set differently.

Hence, with the invention, it is possible to treat each wafer individually, each completely at one time (e.g., with flash lamp, rapid thermal annealing, etc.) by rapidly heating up and cooling down the complete wafer, or the annealing could be performed at different portions of the wafer locally (e.g., spot-to-spot, multiple spots at one time, a line, region-to-region, etc.). Thus, if one is willing to go to relatively high temperatures (e.g., 300 to 500° C.), faster processing can result and yet there is no degradation of the underlying silicon or magnetic stack properties.

While the invention has been described in terms of several exemplary embodiments, those skilled in the art will recognize that the invention can be practiced with modification within the spirit and scope of the appended claims.

For example, the invention would be especially useful for producing structures using AF-based stacks such as MRAMs, read heads, sensors, micro-electrical-mechanical (MEMS) structures, and the like.

Additionally, with the local option, each wafer can be treated differently.

With the local anneal, several applications are immediately evident including a sensor-bridge application where the orientation of the reference layer may be oriented differently (e.g., by 90 degrees or the like). Such is not possible with the batch processing. Another application is a different module orientation in embedded -DRAMS/design.

Further, it is noted that, Applicant's intent is to encompass equivalents of all claim elements, even if amended later during prosecution.

What is claimed is:

1. A method of thermally treating a magnetic layer of a wafer, comprising:

annealing, for a predetermined short duration, a magnetic layer of a single wafer;

applying at least one local magnetic field to said magnetic layer obtained without making electrical contact to the wafer; and cooling the single wafer using argon, wherein said annealing comprises heating only a local area on the single wafer at a temperature of 280 degrees C for 60 seconds in the presence of a magnetic field using a rapid thermal anneal (RTA) lamp, wherein said applying a magnetic field to said magnetic layer is conducted after said annealing and comprises applying local fields in different directions to different areas of the single wafer, and wherein said single wafer comprises a magnetic stack formed thereon, said magnetic stack having a structure of 50TaN/50Ta/175PtMn/15CoFe/9Al/50Py/100TaN.

* * * * *